United States Patent
Su et al.

(10) Patent No.: US 10,892,130 B2
(45) Date of Patent: *Jan. 12, 2021

(54) PROTECTION DEVICE AND CIRCUIT PROTECTION APPARATUS CONTAINING THE SAME

(71) Applicant: Polytronics Technology Corp., Hsinchu (TW)

(72) Inventors: Tsungmin Su, Hsinchu (TW); Tongcheng Tsai, Tainan (TW); David Shau Chew Wang, Taipei (TW)

(73) Assignee: POLYTRONICS TECHNOLOGY CORP., Hsinchu (TW)

( * ) Notice: Subject to any disclaimer, the term of this patent is extended or adjusted under 35 U.S.C. 154(b) by 406 days.

This patent is subject to a terminal disclaimer.

(21) Appl. No.: 15/924,841

(22) Filed: Mar. 19, 2018

(65) Prior Publication Data

US 2019/0122847 A1    Apr. 25, 2019

(30) Foreign Application Priority Data

Oct. 19, 2017  (TW) ................... 106135938

(51) Int. Cl.
*H02H 5/00* (2006.01)
*H01H 85/46* (2006.01)
*H01H 37/76* (2006.01)
*H05K 1/02* (2006.01)
*H01H 85/046* (2006.01)

(52) U.S. Cl.
CPC ........ *H01H 85/463* (2013.01); *H01H 37/761* (2013.01); *H05K 1/0263* (2013.01); *H01H 85/046* (2013.01); *H01H 2085/466* (2013.01)

(58) Field of Classification Search
None
See application file for complete search history.

(56) References Cited

U.S. PATENT DOCUMENTS

| 9,972,991 B2* | 5/2018 | Wang | H01H 85/0241 |
| 2006/0215342 A1* | 9/2006 | Montoya | H01C 1/148 |
| | | | 361/103 |
| 2014/0340046 A1* | 11/2014 | Komori | H02H 9/041 |
| | | | 320/134 |

FOREIGN PATENT DOCUMENTS

| CN | 101138062 A | 3/2008 |
| CN | 104508789 A | 4/2015 |
| CN | 104701296 A | 6/2015 |
| TW | I-597754 B | 9/2017 |

* cited by examiner

*Primary Examiner* — Stephen W Jackson
(74) *Attorney, Agent, or Firm* — Muncy, Geissler, Olds & Lowe, P.C.

(57) ABSTRACT

A protection device comprises a first planar substrate, a second planar substrate, a heating element and a fusible element. The second planar substrate is attached to the underside of the first planar substrate to form a composite structure. The heating element comprises an insulating layer and a heating layer disposed thereon. The heating element is disposed on the first planar substrate, and the insulating layer is disposed between the first planar substrate and the heating layer. The fusible element is disposed above the heating element. The heating element heats up to blow the fusible element in the event of over-voltage or over-temperature.

14 Claims, 6 Drawing Sheets

PROTECTION DEVICE AND CIRCUIT PROTECTION APPARATUS CONTAINING THE SAME

BACKGROUND OF THE INVENTION

(1) Field of the Invention

The present application relates to a protection device applied to an electronic apparatus and a circuit protection apparatus containing the same. More specifically, it relates to a protection device and a circuit protection apparatus capable of preventing over-voltage, over-current and/or over-temperature.

(2) Description of the Related Art

Fuses containing low-melting metals, e.g., lead, tin, silver, bismuth, and copper, are well-known protection devices to cut off currents. To prevent over-current and over-voltage, various protection devices are continuously developed. For example, a device containing a substrate on which a heating layer and a low-melting metal layer are stacked in sequence. The heating layer heats up in the event of over-voltage, and then the heat is transferred upwards to the low-melting metal layer. As a result, the low-melting metal layer is melted and blown to sever currents flowing therethrough, so as to protect circuits or electronic apparatuses.

Recently, mobile apparatuses such as cellular phones and laptop computers are widely used, and people increasingly rely on such products over time. However, burnout or explosion of batteries of cellular phones or portable products during charging or discharging is often seen. Therefore, the manufacturers continuously improve the designs of over-current and over-voltage protection devices to prevent the batteries from being blown due to over-current or over-voltage during charging or discharging.

In a know protection device, the low-melting metal layer is in series connection to a power line of a battery and the low-melting metal layer and a heating layer are electrically coupled to a switch and an integrated circuit (IC) device. When the IC device detects an over-voltage event, the IC device enables the switch to "on". As a result, current flows through the heating layer to generate heat to melt and blow the low-melting metal layer, so as to sever the power line to the battery for over-voltage protection. Moreover, it can be easily understood by the people having ordinary knowledge in the art that the low-melting metal layer, e.g., fuses, can be heated and blown by a large amount of current in the event of over-current, and therefore over-current protection can be achieved also.

FIG. 1 shows a known cross-sectional view of a protection device implementing the above-mentioned protection mechanism. A protection device 100 comprises a substrate 110, a heating element 120, an insulating layer 130, a low-melting metal layer 140, a flux 150 and a housing 170. The housing 170 is placed on the substrate 110 and has an internal space to receive the heating element 120, the insulating layer 130, the low-melting metal layer 140 and the flux 150. The heating element 120 is disposed on the substrate 110 and electrically connects to two heating element electrodes 125. The low-melting metal layer 140 connects to electrodes 160 at two sides and an intermediate electrode 165 in the middle. The insulating layer 130 covers the heating element 120 and the heating element electrodes 125. The low-melting metal layer 140 is disposed above the insulating layer 130 to be a fuse, and is overlaid by the flux 150. As a result, the heating element 120 heats up to melt the low-melting layer 140, and then the low-melting metal layer 140 flows to the two electrodes 160 and the intermediate electrode 165. More specifically, the two electrodes 160 and the intermediate electrode 165 accumulate the molten metal of the low-melting metal layer 140, resulting in that the low-melting metal layer 140 is divided into three pieces to cut off the current flowing through it for protection. Because the heating element 120 is in direct contact with the substrate 110 which usually has a much larger area, the heat generated by the heating element 120 may not transfer uniformly and concentrate on a region of the substrate 110 to induce cracking. Moreover, the low-melting metal layer 140 connects to external electrodes through usually small cross-sectional areas, and thus it is not suitable for large current (>70 A) applications.

SUMMARY OF THE INVENTION

The present application provides a protection device and a circuit protection apparatus containing the same for over-current, over-voltage and/or over-temperature protection, and it is suitable for large current (e.g., 60-300 A) applications. The heating element of the protection device is modularized to be uniformly heat-conductive, so as to withstand a large power without damage. Moreover, the protection device is able to blow the fusible element thereof by a relatively small power.

In accordance with a first aspect of the present application. a protection device comprises a first planar substrate, a second planar substrate, a heating element and a fusible element. The second planar substrate is attached to a lower surface of the first planar substrate to form a composite structure. The heating element comprises an insulating layer and a heating layer disposed thereon. The heating element is disposed on the first planar substrate, and the insulating layer is disposed between the first planar substrate and the heating layer. The fusible element is disposed above the heating element. The heating element heats up to blow the fusible element in the event of over-voltage or over-temperature.

In an embodiment, the insulating layer has an area capable of uniformly dissipating the heat of the heating layer to avoid cracking on the insulating layer.

In an embodiment, the area of the insulating layer is 1-2 times that of the heating layer.

In an embodiment, the protection device further comprises two external electrodes connecting to two ends of the fusible element, and the external electrode has a larger cross-sectional area than the fusible element along a current direction.

In an embodiment, the external electrode has a recess to receive the end of the fusible element.

In an embodiment, the protection device further comprises an intermediate electrode connecting to an underside of the fusible element.

In an embodiment, the insulating layer has a surface provided with two heating element electrodes connecting to two ends of the heating layer.

In an embodiment, one of the two heating element electrodes electrically connects to the intermediate electrode.

In an embodiment, when a crack occurs in the first planar substrate due to overheat, the crack does not extend to the second planar substrate.

In accordance with a second aspect of the present application, a circuit protection apparatus comprises the aforementioned protection device associated with a detector and a switch. The detector is adapted to detect voltage drops or temperatures of a circuit to be protected, and the switch is coupled to the detector to receive its sensing signals. When a voltage drop or a temperature exceeds a threshold value, the switch turns on to allow current to flow through the heating element by which the heating element heats up to melt and blow the fusible element.

The external electrodes connecting to the fusible element have large cross-sectional areas, and thus the protection device of the present application is suitable for large current applications, e.g., a rated current of 60-300 A. The heating layer of the heating element of the protection device is carried by the insulating layer which can uniformly absorb and conduct the heat generated by the heating layer to avoid cracking, so as to increase endurable power of the heating element. Specifically, the protection device of the present application uses a composite substrate with higher reliability.

BRIEF DESCRIPTION OF THE DRAWINGS

The present application will be described according to the appended drawings in which.

DETAILED DESCRIPTION OF THE INVENTION

The making and using of the presently preferred illustrative embodiments are discussed in detail below. It should be appreciated, however, that the present application provides many applicable inventive concepts that can be embodied in a wide variety of specific contexts. The specific illustrative embodiments discussed are merely illustrative of specific ways to make and use the invention, and do not limit the scope of the invention.

Figure 1:
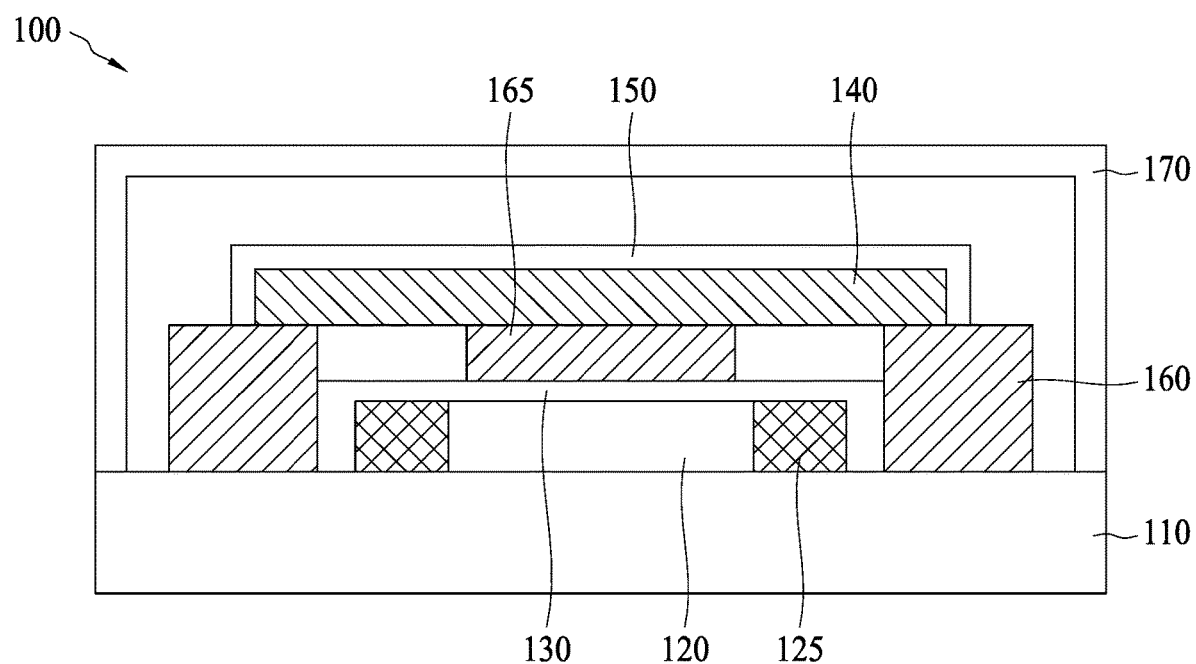
FIG. 1 shows a known protection device.
Figure 2:
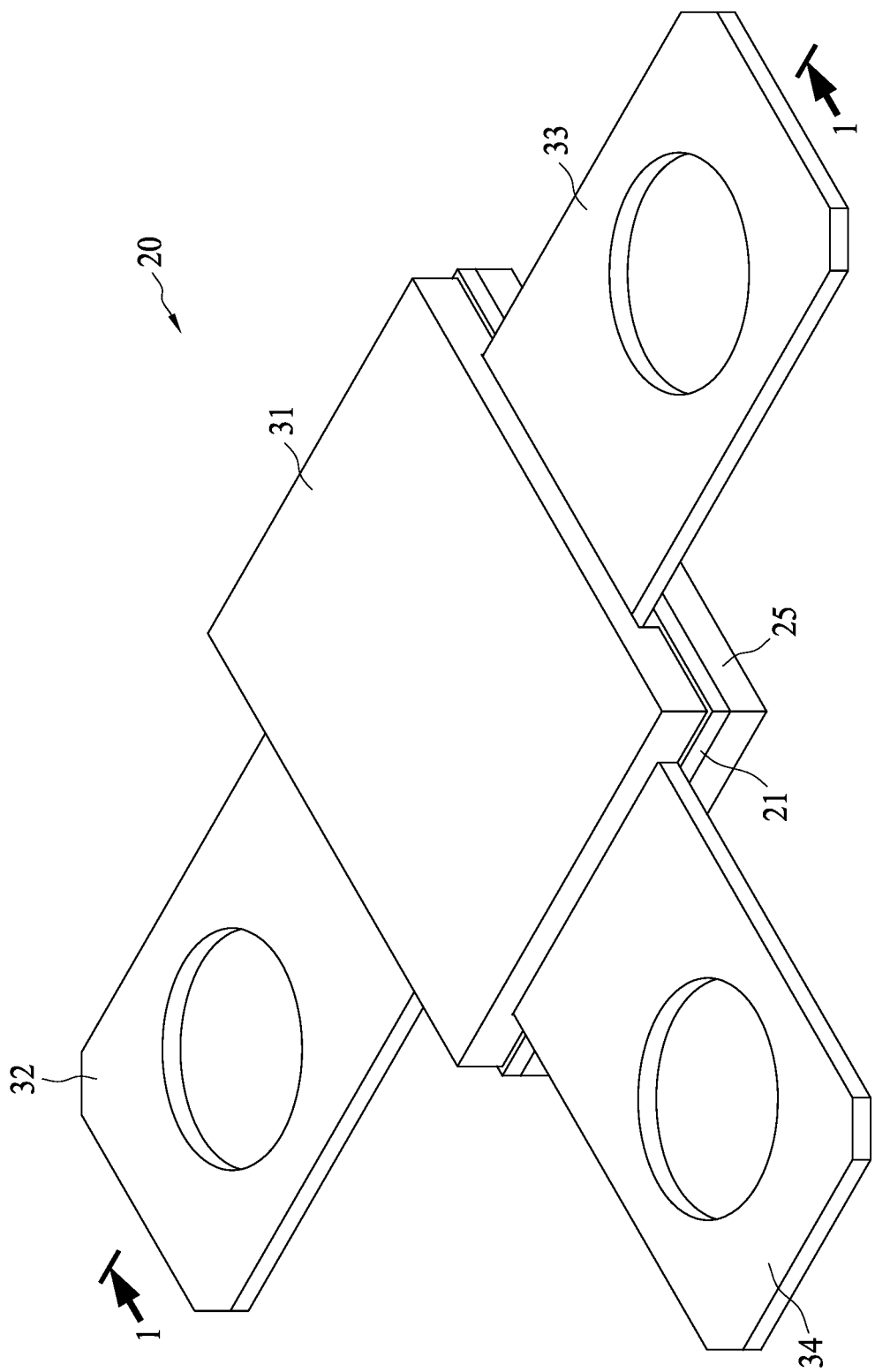
FIG. 2 shows a protection device in accordance with an embodiment of the present application.
Figure 3:
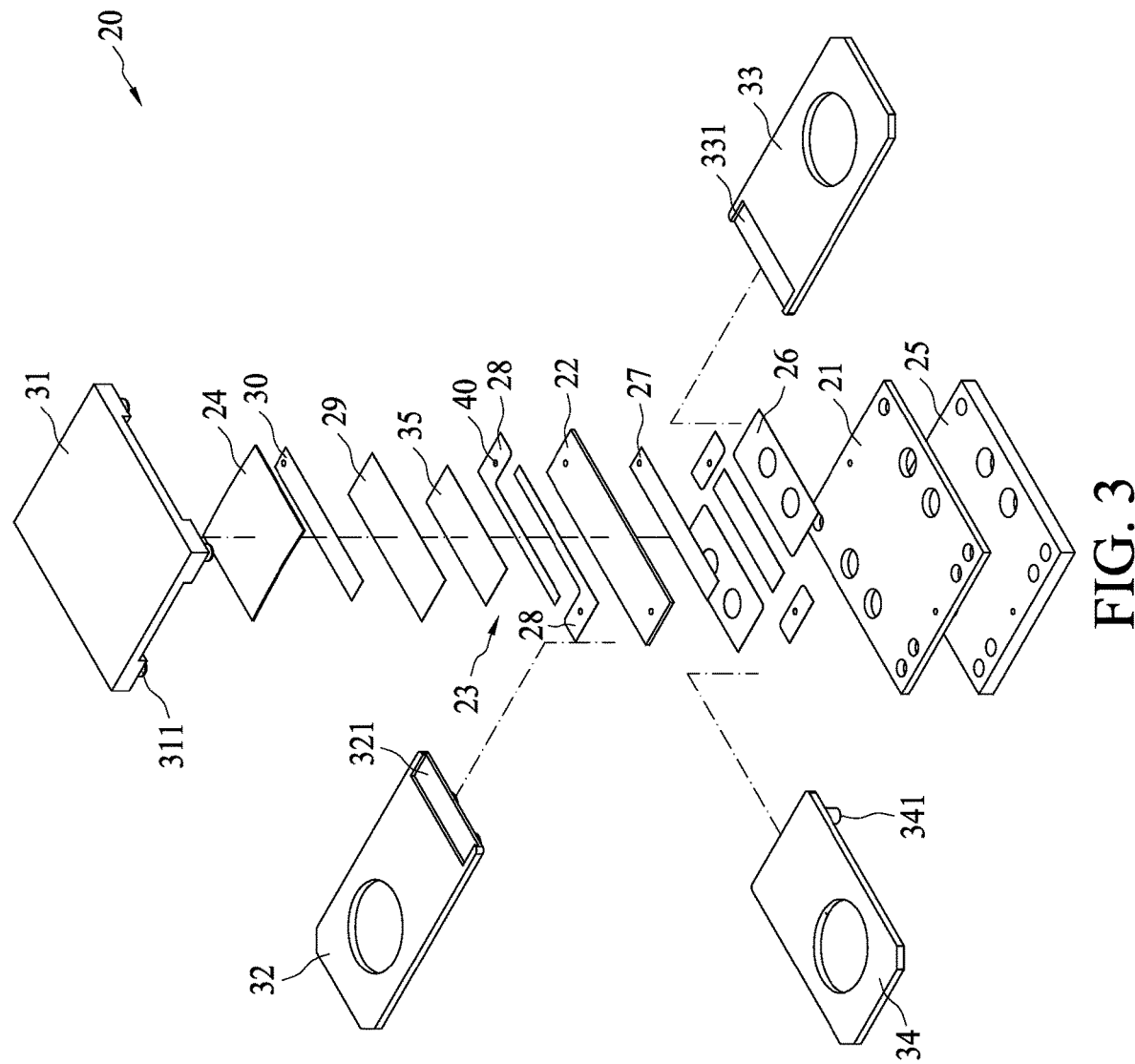
FIG. 3 shows an exploded view of the protection device of FIG. 2.
Figure 4:
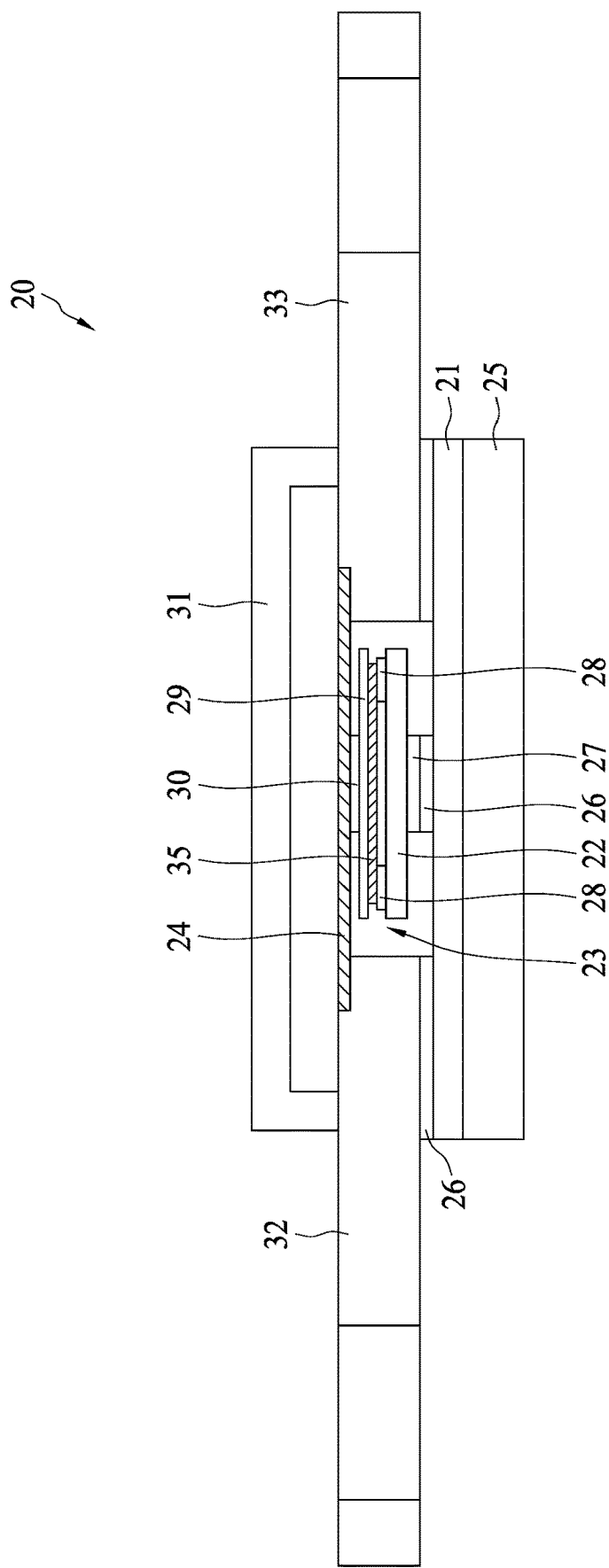
FIG. 4 shows a cross-sectional view along a line 1-1 of FIG. 2.
Figure 5:
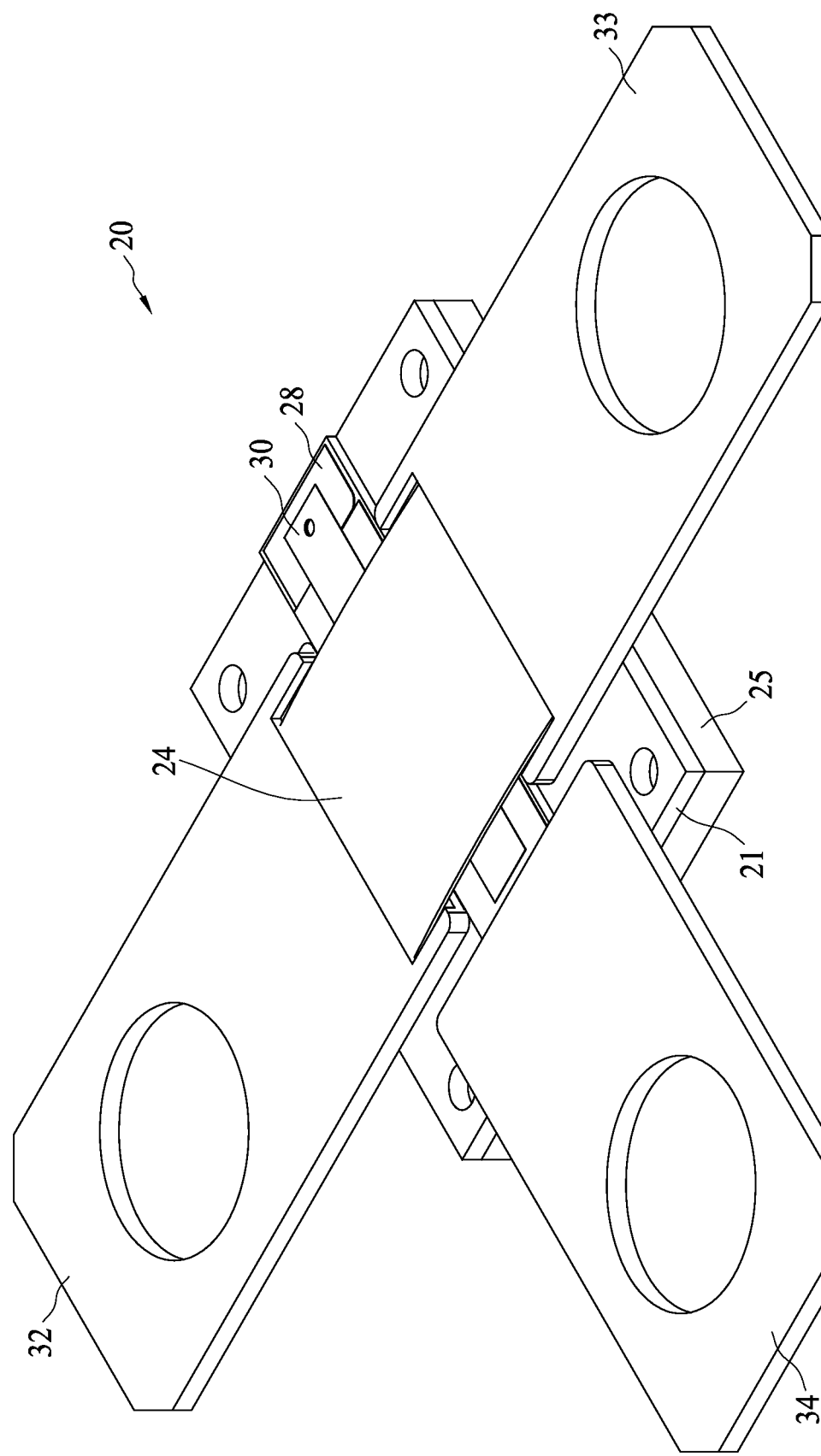
FIG. 5 shows the protection device excluding an upper cover of FIG. 2.

FIG. 2 shows a protection device 20 in accordance with an embodiment of the present application, and FIG. 3 shows an exploded view of the protection device 20. FIG. 4 shows a cross-sectional view along a line 1-1 of the protection device 20 in FIG. 2. FIG. 5 shows the protection device 20 without an upper cover 31 in FIG. 2. The protection device 20 essentially comprises a heating element 23 and a fusible element 24. When over-voltage or over-temperature occurs, the heating element 23 heats up to blow the fusible element 24 for over-voltage or over-temperature protection. The protection device 20 comprises a first planar substrate 21 on which an electrode layout 26, an electrode layer 27, a heating element 23, a fusible element 24 and an upper cover 31 are stacked in sequence. The heating element 23 disposed on the first planar substrate 21 is a heating module employing an insulating layer 22 as a base. The heating element 23 comprises an insulating layer 22 and a heating layer 35 disposed on the insulating layer 22, and the insulating layer 22 is disposed between the first planar substrate 21 and the heating layer 35. Two heating element electrodes 28 may be formed on the insulating layer 22 by printing, and the heating layer 35 may be formed on heating element electrodes 28 by printing as well. Two ends of the heating layer 35 connects to strip-like extension portions of the heating element electrodes 28 to establish an electric path. The fusible element 24 is disposed above the heating element 23 and its two ends connect to external electrodes 32 and 33 to form an electric path. In this embodiment, an intermediate electrode 30 connects to a center portion of the underside of the fusible element 24 and a corresponding heating element electrode 28, and thereby the fusible element 24 forms a circuit comprising two fuses. The fusible element 24 may be covered by rosin, soft metal or flux. An insulating layer 29 is disposed between the heating layer 35 and the intermediate electrode 30 for isolation. An electrode layout 26 is disposed on the first planar substrate 21 to connect to external electrodes 32, 33 and 34. The electrode layer 27 connects to the heating element 23 and the electrode layout 26. In an embodiment, the lower surface of the first planar substrate 21 is associated with a second planar substrate 25 of an equivalent thickness or a thicker second planar substrate 25 to form a combination. More specifically, the second planar substrate 25 is attached to the underside of the first planar substrate 21 to form a composite structure to increase structural strength. In the event of localized high heat, the heat concentrates on the first planar substrate 21 adjacent to the heating element 23. Even if a crack occurs in the first planar substrate 21, the crack does not extend to the second planar substrate 25. Therefore, the crack is limited within the first planar substrate 21 to avoid cracking in the second planar substrate 25. A thicker second planar substrate 25 provides better strength to sustain normal operation of the protection device 20 even if the first planar substrate 21 is cracked. In an embodiment, four posts 311 formed on the upper cover 31 insert into corresponding holes in the first planar substrate 21 and the second planar substrate 25 for assembly. The upper cover 31 and the first planar substrate 21 form a space to receive components such as the heating element 23 and the fusible element 24. The first planar substrate 21, the second planar substrate 25, the electrode layout 26, the electrode layer 27, the insulating layer 22, the heating element electrodes 28 and the intermediate electrode 30 may be provided with alignment holes, so as to increase assembling efficiency and accuracy. For example, one of the heating element electrode 28 is aligned with the intermediate electrode 30 by alignment holes 40. In an embodiment, the lower surface of the external electrode 34 is provided with a post 341 to be inserted into corresponding holes of the first planar substrate 21 and the second planar substrate 25 for jointing.

The external electrodes 32 and 33 have recesses 321 and 331 to precisely joint the fusible element 24. In this embodiment, the cross-sectional area of the external electrode 32 or the external electrode 33 is larger than the cross-sectional area of the fusible element 24 along a current direction. By such a large cross-sectional area, the design is suitable for large current applications, e.g., a protection device of a rate current of 60-300 A. In this embodiment, the heating layer 35 is made on a basis of the insulating layer 22 to form the heating element 23. The insulating layer 22 may comprise ceramic material and have an area covering and slightly larger than the area of the heating layer 35, e.g., 1-2 times. An adequate area of the insulating layer 22 can uniformly and effectively dissipate the heat generated from the heating layer 35 to avoid cracking caused by heat concentration on a region of the insulating layer 22 having a large area which may exhibit nonuniform heat dissipation. As a result, the heating element 23 can withstand a large power without damage. The heating layer 35 is not in direct contact with the first planar substrate 21, thereby decreasing the probability of cracking on the first planar substrate 21. Because modularized heat element 23 does not dissipate heat easily, a blowing power of the fusible element 24 can be lowered to approximately half power of a traditional design.

In an embodiment, the first planar substrate 21 and the second planar substrate 25 may be rectangular insulating substrates including aluminum oxide, aluminum nitride, zirconium oxide, or may use heat-endurable glass substrates. The electrode layout 26, the electrode layer 27, the heating element electrodes 28 and the intermediate electrode 30 may comprise silver, gold, copper, tin, nickel or other conductive metals, and its thickness is approximately 0.005-1 mm, or 0.01 mm, 0.05 mm, 0.1 mm, 0 3 mm or 0.5 mm in particular. In addition to making the electrodes by printing, they may be alternatively made of metal sheets for high-voltage applications. The fusible element 24 may employ low-melting metal or the alloys thereof, e.g., Sn—Pb—Ag, Sn—Ag, Sn—Sb, Sn—Zn, Zn—Al, Sn—Ag—Cu, Sn, Sn—Bi—Ag, and Sn—Bi—Ag—Cu. In the present application, it is preferable to use but not limited to the lead-free materials to lower resistance for large current applications. The length and width of the fusible element 24 can be adjusted upon desired current values. The fusible element 24 has a thickness of 0.005-1 mm, preferably 0.01-0.5 mm and most preferably 0.02-0.2 mm, e.g., 0.05 mm, 0.1 mm or 0.3 mm. The heating element 35 may comprise ruthenium oxide ($RuO_2$) with additives of silver (Ag), palladium (Pd), and/or platinum (Pt). The insulating layer 29 between the heating element 23 and the fusible element 24 may contain glass, epoxy, aluminum oxide, silicone or glaze.

The external electrodes 32, 33 and 34 are metal sheets extending horizontally, and may have holes to engage with an external power source or a circuit to be protected by, for example, screws. Alternatively, the protection device may be modified to be a surface-mountable device by connecting to the bonding pads at a lower surface of the protection device through conductive holes or conductive surfaces on the sidewalls of the protection device.

Figure 6:
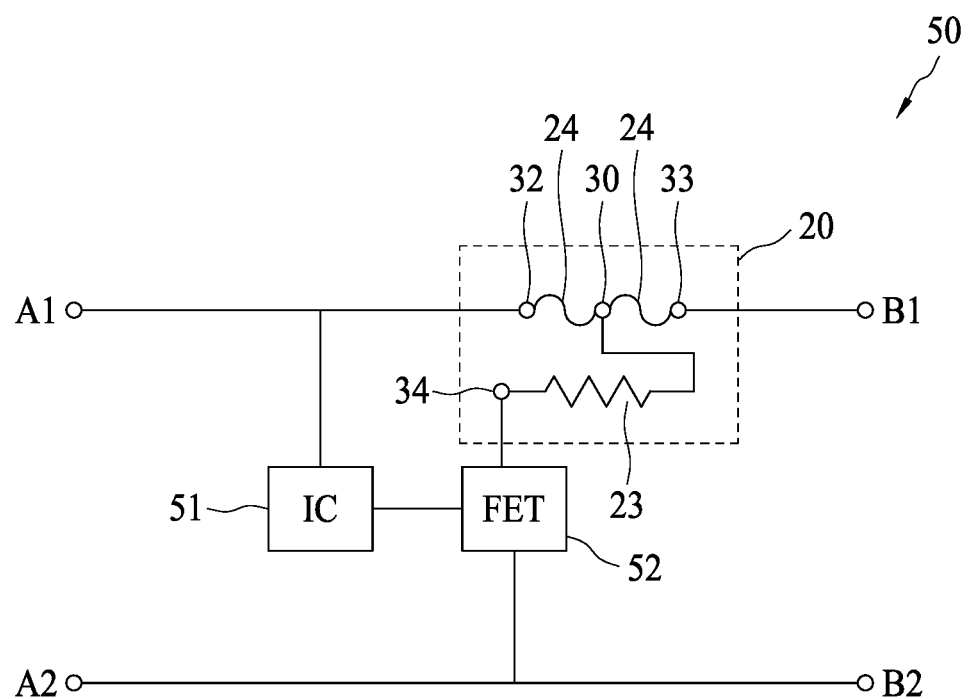
FIG. 6 shows a circuit diagram of a circuit protection apparatus in accordance with an embodiment of the present application.

The equivalent circuit diagram of the protection device 20 of this embodiment is depicted in a dashed-line block in FIG. 6. The external electrode 32 connects to a terminal A1 of an apparatus to be protected such as a secondary battery or a motor, whereas the external electrode 33 connects to a terminal B1 of a charger or the like. The external electrode 34 connects to the heating element 23, and another end of the heating element 23 connects to the intermediate electrode 30. According to this circuit design of the protection device 20, the fusible element 24 forms a circuit containing two fuses in series connection, and the heating element 23 forms a heater denoted by a resistor. In an embodiment, the external electrode 34 electrically connects to the switch 52 which may be a field-effect transistor (FET). The gate electrode of the switch 52 connects to a detector 51, and the switch 52 connects to a terminal A2 of the apparatus to be protected and a terminal B2 of the charger. The detector 51 may be an IC device capable is of sensing voltage drops and temperatures of the circuit. If no over-voltage and over-temperature event, the switch 52 is off, current flows through fusible element 24 and no current flows through the heating element 23. If over-current occurs, the fusible element 24 is blown to provide over-current protection. When the detector 51 senses a voltage or a temperature larger than a threshold value, i.e., over-voltage or over-temperature, the switch 52 turns on to allow current to flow through the source and drain electrodes of the switch 52 and the heating element 23, and accordingly the heating element 23 heats up to blow the fusible element 24 to provide over-voltage and over-temperature protections. In summary, two power lines of B1 to A1 and B2 to A2 supply power to the circuit to be protected. The protection device 20, the detector 51 and the switch 52 are coupled to the two power lines to form a circuit protection apparatus 50. If the detector 51 senses a voltage drop or a temperature over a threshold value, then the heating element 23 is activated to blow the fusible element 24.

The equivalent circuit diagrams of the protection devices of the aforesaid embodiments comprise two fuses and a heater. Nevertheless, variant designs in terms of structure or circuit may be used to form a protection device containing two fuses and two heaters, or one fuse and one heater, which are also covered by the scope of the present application. In an embodiment, the fusible element may electrically connect to two external electrodes or two bonding pads to form a current path and the heating element electrically connect to another two external electrodes or two bonding pads to form another current path, so as to independently control the current flowing through the heating element to blow the fusible element.

In summary, the insulating layer can uniformly dissipate heat from the heating layer without cracking, and thus the heating element can withstand a large power without damage. The composite of combining the first and second planar substrates increases structural strength. Moreover, a crack in the first planar substrate caused by overheat at most extends to the interface of the first planar substrate and the second planar substrate, and therefore an undamaged second planar substrate is sustained to maintain normal operation of the protection device. The external electrodes to which the fusible element connected have large cross-sectional areas to allow current to flow therethrough for large current applications, e.g., 60-300 A. Moreover, the modularized heat element reduces heat dissipation, and thus heat generated therefrom is more concentrated to decrease the blowing power of the fusible element.

The above-described embodiments of the present invention are intended to be illustrative only. Numerous alternative embodiments may be devised by persons skilled in the art without departing from the scope of the following claims.

What is claimed is:

1. A protection device, comprising:
   a first planar substrate;
   a second planar substrate attached to a lower surface of the first planar substrate to form a composite structure;
   a heating element comprising an insulating layer and a heating layer disposed on the insulating layer, the heating element being disposed on the first planar substrate, the insulating layer being disposed between the first planar substrate and the heating layer; and
   a fusible element disposed above the heating element;
   wherein the heating element heats up to blow the fusible element in the event of over-voltage or over-temperature.

2. The protection device of claim 1, wherein the insulating layer has an area capable of uniformly dissipating the heat of the heating layer to avoid cracking on the insulating layer.

3. The protection device of claim 1, wherein the area of the insulating layer is 1-2 times that of the heating layer.

4. The protection device of claim 1, further comprising two external electrodes connecting to two ends of the fusible element, the external electrode having a larger cross-sectional area than the fusible element.

5. The protection device of claim 4, wherein the external electrode has a recess to receive the end of the fusible element.

6. The protection device of claim 1, further comprising an intermediate electrode connecting to an underside of the fusible element.

7. The protection device of claim 6, wherein the insulating layer has a surface provided with two heating element electrodes connecting to two ends of the heating layer.

8. The protection device of claim 7, wherein one of the two heating element electrodes electrically connects to the intermediate electrode.

9. The protection device of claim 7, wherein one of the heating element electrodes is aligned with the intermediate electrode by alignment holes.

10. The protection device of claim 1, wherein when a crack occurs in the first planar substrate due to overheat, the crack does not extend to the second planar substrate.

11. The protection device of claim 1, wherein the protection device allows a current of 60-300 A to flow therethrough.

12. A circuit protection apparatus, comprising:
a protection device, comprising:
a first planar substrate;
a second planar substrate attached to a lower surface of the first planar substrate to form a composite structure;
a heating element comprising an insulating layer and a heating layer disposed on the insulating layer, the heating element being disposed on the first planar substrate, the insulating layer being disposed between the first planar substrate and the heating layer; and
a fusible element disposed above the heating element; and
a detector senses a voltage drop or a temperature of a circuit to be protected; and
a switch coupled to the detector to receive signals of the detector;
wherein the switch turns on to allow current to flow through the heating element by which the heating element heats up to blow the fusible element when the detector senses the voltage drop or the temperature exceeding a threshold value.

13. The circuit protection apparatus of claim 12, wherein the insulating layer has an area capable of uniformly dissipating the heat of the heating layer to avoid cracking on the insulating layer.

14. The circuit protection apparatus of claim 12, wherein the protection device further comprises two external electrodes connecting to two ends of the fusible element, the external electrode has a larger cross-sectional area than the fusible element.

* * * * *